US011263421B2

(12) United States Patent
Liu

(10) Patent No.: US 11,263,421 B2
(45) Date of Patent: Mar. 1, 2022

(54) DUAL TOUCH SENSOR ARCHITECTURE WITH XY-POSITION AND Z-FORCE SENSING FOR TOUCH-ON-SURFACE BUTTON

(71) Applicant: TEXAS INSTRUMENTS INCORPORATED, Dallas, TX (US)

(72) Inventor: Dongtai Liu, Fremont, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 202 days.

(21) Appl. No.: 15/461,419

(22) Filed: Mar. 16, 2017

(65) Prior Publication Data

US 2017/0269754 A1 Sep. 21, 2017

Related U.S. Application Data

(60) Provisional application No. 62/315,643, filed on Mar. 30, 2016, provisional application No. 62/309,416, filed on Mar. 16, 2016.

(51) Int. Cl.
*G06K 9/00* (2006.01)
*G06F 3/041* (2006.01)
(Continued)

(52) U.S. Cl.
CPC ......... *G06K 9/0002* (2013.01); *G06F 3/0416* (2013.01); *G06F 3/0443* (2019.05);
(Continued)

(58) Field of Classification Search
CPC .... G06K 9/0002; G06K 9/2009; H03K 17/97; H03K 17/962; H03K 2217/9651;
(Continued)

(56) References Cited

U.S. PATENT DOCUMENTS

| 2008/0202824 A1* | 8/2008 | Philipp | G06F 3/0488 |
| | | | 178/18.01 |
| 2009/0231019 A1* | 9/2009 | Yeh | G06F 3/0202 |
| | | | 327/509 |

(Continued)

*Primary Examiner* — Kenneth Bukowski
(74) *Attorney, Agent, or Firm* — Ray A. King; Charles A. Brill; Frank D. Cimino

(57) ABSTRACT

A dual touch sensor with XY-position and Z-force sensing, such as for implementing a touch button, includes a touch sensor assembly with: (a) an XY-position sensor (such as capacitive, single ended or differential) including an XY electrode disposed at the backside of the touch surface opposite the button area to define an XY sensing area corresponding to the button area, the XY-position sensor to sense a touch within the XY sensing area, as a button-touch event; and (b) a Z-force sensor (such as inductive or capacitive) including a Z-electrode to sense touch-pressure deflection of the touch surface, including to sense a touch-pressure deflection that exceeds a button-press threshold as a button-press event. Sensor electronics coupled to the XY-position sensor and the Z-force sensor detects, as a button touch-press condition, the capacitive XY-position sensor sensing a button-touch event, substantially contemporaneous with the Z-Force sensor sensing a button-press event.

13 Claims, 4 Drawing Sheets

(51) Int. Cl.
  *G06K 9/20*     (2006.01)
  *H03K 17/96*    (2006.01)
  *H03K 17/97*    (2006.01)
  *G06F 3/044*    (2006.01)

(52) U.S. Cl.
  CPC ......... *G06F 3/0444* (2019.05); *G06K 9/2009* (2013.01); *H03K 17/962* (2013.01); *H03K 17/97* (2013.01); *G06F 2203/04105* (2013.01); *H03K 2217/9651* (2013.01); *H03K 2217/96054* (2013.01)

(58) Field of Classification Search
  CPC .......... H03K 2217/96054; G06F 3/044; G06F 3/0416; G06F 2203/04105
  See application file for complete search history.

(56) References Cited

U.S. PATENT DOCUMENTS

| | | | | |
|---|---|---|---|---|
| 2014/0098042 A1* | 4/2014 | Kuo | ............... | G06F 3/016 |
| | | | | 345/173 |
| 2015/0091867 A1* | 4/2015 | Bokma | ............... | G06F 3/03547 |
| | | | | 345/174 |
| 2017/0097718 A1* | 4/2017 | Oh | ............... | G06F 3/04144 |
| 2018/0348865 A1* | 12/2018 | Czelnik | ............... | B60K 37/06 |

* cited by examiner

DUAL TOUCH SENSOR ARCHITECTURE WITH XY-POSITION AND Z-FORCE SENSING FOR TOUCH-ON-SURFACE BUTTON

CROSS-REFERENCE TO RELATED APPLICATIONS

Priority is claimed under 37 CFR 1.78 and 35 USC 119(e) to U.S. Provisional Application 62/309,416, filed 16 Mar. 2016), and U.S. Provisional Application 62/315,643, filed 30 Mar. 2016), which are incorporated by reference.

BACKGROUND

Technical Field

This Patent Disclosure relates to touch sensing for touch-on-surface (ToS) buttons/keys, such as for use in mobile/personal communications/computing devices.

Related Art

In mobile devices (and other equipment), touch sensing technology can be used to replace physical/mechanical buttons. Touch sensing, which can be based on capacitive and inductive sensing, can be used to detect touch-press of a ToS touch button defined on a touch surface (such as a section/segment of the device case). Touch sensing can be used to detect both XY position on a touch surface, and Z-force, such as based on surface deflection/deformation.

Touch sensing technology can be can be used with different touch surfaces, including nonconductive, conductive and nonconductive with a conductive coating. Touch sensing to replace physical/mechanical buttons is distinguished from, for example, capacitive touch buttons defined on a device screen.

While this Background information references touch input for mobile/personal communication/computing devices, this Patent Disclosure is more generally directed to input button/keys based on touch sensing.

BRIEF SUMMARY

This Brief Summary is provided as a general introduction to the Disclosure provided by the Detailed Description and Drawings, summarizing aspects and features of the Disclosure. It is not a complete overview of the Disclosure, and should not be interpreted as identifying key elements or features of, or otherwise characterizing or delimiting the scope of, the disclosed invention.

The Disclosure describes apparatus and methods for a dual touch sensor architecture with XY-position and Z-force sensing, such as for a touch-on-surface button, such as for a mobile communications device.

According to aspects of the Disclosure, dual (XY/Z) touch sensing with XY-position and Z-force sensing can be implemented in a device that includes a case with a touch surface that is deflectable based on touch pressure applied to the surface, and a button area defined on the surface. Dual XY/Z touch sensing can be implemented with a touch sensor assembly within the case, that includes: (a) an XY-position sensor including an XY electrode disposed at the backside of the touch surface opposite the button area to define an XY sensing area corresponding to the button area, the XY-position sensor to sense a touch within the XY sensing area, as a button-touch event; and (b) a Z-force sensor including a Z-electrode to sense touch-pressure deflection of the touch surface, including to sense a touch-pressure deflection that exceeds a button-press threshold as a button-press event. Sensor electronics coupled to the XY-Position sensor and the Z-Force sensor to detect, as a button touch-press condition, the capacitive XY-Position sensor sensing a button-touch event, substantially contemporaneous with the Z-Force sensor sensing a button-press event.

According to other aspects of the Disclosure, the XY-position sensor can be: (a) an XY capacitive sensor with an XY capacitive electrode (or an XY capacitive electrode with a differential reference capacitive electrode, such as in a ring configuration), or (b) a fingerprint sensor. According to other aspects of the Disclosure, sensing a touch-pressure deflection of the device surface can be implemented by either: (a) an inductive Z-Force sensor, including a Z inductor coil, a Z conductive target disposed between the Z inductor coil, and the XY capacitive electrode, with elastic insulator material disposed between the XY capacitive electrode and the Z conductive target, and between the Z conductive target and the Z inductor coil, such that the touch-pressure deflection of the surface causes a corresponding movement of the Z conductive target toward the Z inductor coil; or (b) a capacitive Z-force sensor, including a Z conductive target, and a Z capacitive electrode disposed between the Z conductive target, and the XY capacitive electrode, with elastic insulator material disposed between the XY capacitive electrode and the Z capacitive electrode, and between the Z capacitive electrode, and the Z conductive target, such that the touch-pressure deflection of the surface causes a corresponding movement of the Z capacitive electrode toward the Z conductive target.

Other aspects and features of the invention claimed in this Disclosure will be apparent to those skilled in the art from the following Description read in conjunction with the Drawings.

BRIEF DESCRIPTION OF THE DRAWINGS

FIG. 3 illustrates an example differential touch sensor [20] including a capacitive XY-position sensor [21/22, 28] with differential XY capacitive electrodes [21/22] to detect button-touch [15], and an inductive Z-force sensor [25/25A, 29] including a Z inductor coil [25] to detect button-press surface deflection [FIG 1B, 12/12A]; and FIG. 4 illustrates an example differential touch sensor [20] using capacitive sensing for both XY-position (button-touch) with differential capacitive electrodes [21/22] and Z-force (button-press) with a capacitive electrode [23] and associated conductive target [23A], such as with a multi-channel capacitive sensor electronics 28A.

FIG. 5 illustrates using the XY fingerprint sensor with a Z-force inductive sensor [25/25A, 29]; and FIG. 6 illustrates using the XY fingerprint sensor with a Z-Force capacitive sensor [23/23A, 28].

DETAILED DESCRIPTION

Figure 1A:
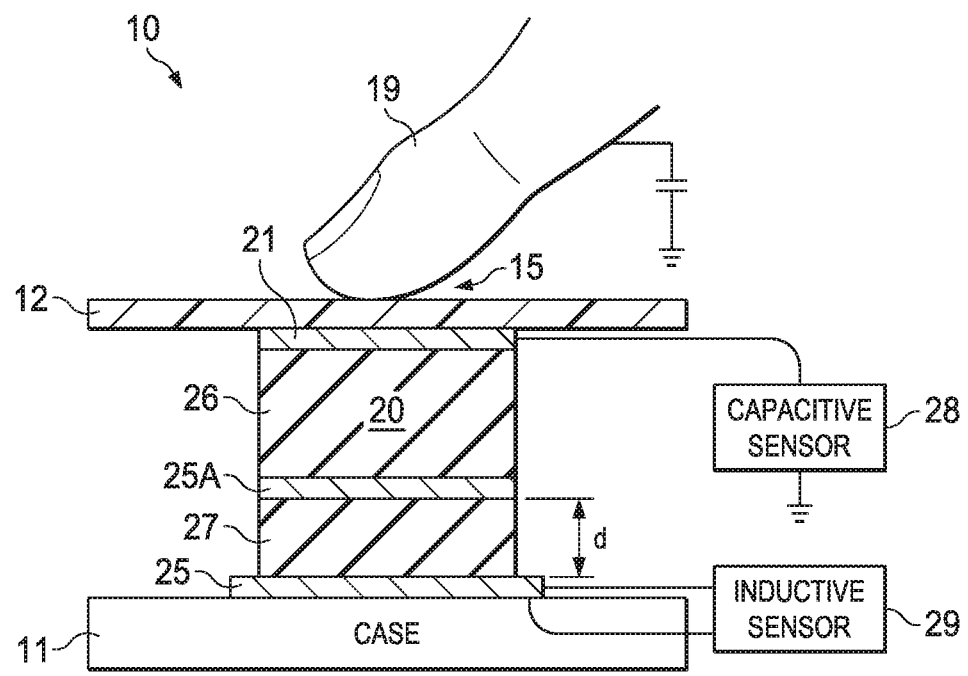
FIGS. 1A/1B illustrates an example embodiment of the dual touch sensor [20] architecture with XY-position [21] and Z-force [25/25A] sensing, such as for a touch-on-surface (ToS) button [12, 15], implemented with a capacitive XY-position sensor [21, 28] including an XY capacitive electrode [21] to detect touch at a touch button [15] defined on a touch surface [12], and an inductive Z-Force sensor [25/25A, 29] including a Z inductor coil [25] to detect surface deflection (FIG. 1B, 12/12A] that causes a corresponding deflection of an associated conductive target [25A].

This Description and the Drawings constitute a Disclosure for a dual touch sensor architecture with XY-position and Z-force sensing, including describing example embodiments, and illustrating various technical features and advantages.

Example embodiments of the dual touch sensor architecture with XY-position/Z-force sensing are described in connection with an example application of a mobile device, in which dual (XY/Z) touch sensing according to this Disclosure can be used to implement a touch-on-surface (ToS) home button defined on the glass display surface of a mobile device, requiring sensing press/force as well as precise position (with specified SNR performance).

The dual (XY/Z) touch sensor enables the XY definition of a precisely defined button area on a touch surface, so that XY-position sensing combined with Z-force sensing can be used to detect button-press conditions (i.e., button-touch sensed contemporaneously with button-press).

In brief overview, in example embodiments, dual (XY/Z) touch sensing with XY-position and Z-force sensing can be implemented in a device that includes a case with a touch surface that is deflectable based on touch pressure applied to the surface, and a button area defined on the surface. Dual XY/Z touch sensing can be implemented with a touch sensor assembly within the case, that includes: (a) an XY-position sensor including an XY electrode disposed at the backside of the touch surface opposite the button area to define an XY sensing area corresponding to the button area, the XY-position sensor to sense a touch within the XY sensing area, as a button-touch event; and (b) a Z-force sensor including a Z-electrode to sense touch-pressure deflection of the touch surface, including to sense a touch-pressure deflection that exceeds a button-press threshold as a button-press event. Sensor electronics coupled to the XY-Position sensor and the Z-Force sensor to detect, as a button touch-press condition, the capacitive XY-Position sensor sensing a button-touch event, substantially contemporaneous with the Z-Force sensor sensing a button-press event.

In other example embodiments, the XY-position sensor can be: (a) an XY capacitive sensor with an XY capacitive electrode (or an XY capacitive electrode with a differential reference capacitive electrode, such as in a ring configuration), or (b) a fingerprint sensor. In other example embodiments, sensing a touch-pressure deflection of the device surface can be implemented by either: (a) an inductive Z-Force sensor, including a Z inductor coil, a Z conductive target disposed between the Z inductor coil, and the XY capacitive electrode, with elastic insulator material disposed between the XY capacitive electrode and the Z conductive target, and between the Z conductive target and the Z inductor coil, such that the touch-pressure deflection of the surface causes a corresponding movement of the Z conductive target toward the Z inductor coil; or (b) a capacitive Z-force sensor, including a Z conductive target, and a Z capacitive electrode disposed between the Z conductive target, and the XY capacitive electrode, with elastic insulator material disposed between the XY capacitive electrode and the Z capacitive electrode, and between the Z capacitive electrode, and the Z conductive target, such that the touch-pressure deflection of the surface causes a corresponding movement of the Z capacitive electrode toward the Z conductive target.

FIGS. 1A/1B illustrates an example embodiment of a device 10 including case 11 and a touch surface/panel 12. A touch button 15 is defined on the touch surface 12.

A dual touch sensor 20 includes a capacitive XY-position sensor 21, 28, and an inductive Z-force sensor 25/25A, 29. The capacitive XY-position sensor can detect a finger touch 19 on/at the touch surface 12, within the area defined by the XY capacitive electrode 21, and signal a button-touch. That is, the sensing area 15 on the touch surface 12, defined by the area above XY capacitive electrode 21, defines a touch button/area on the touch surface (such as the example Home button on a display surface).

The capacitive XY-position sensor includes an XY capacitive electrode 21 disposed at the back-side of touch surface 12, and coupled to capacitive sensor electronics 28. The inductive Z-force sensor includes a Z inductor coil 25, and a spaced conductive target 25A, and coupled to inductive sensor electronics 29. The Z inductor coil can be mounted/printed onto case 11 (or some other structure). The conductive target 25A is disposed intermediate the XY capacitive electrode and the Z inductor coil, separated by an elastic/compressible insulator material (such as dielectric foam) 26/27. The Z-force inductive sensor 25/25A, 29 detects a change in the distance d caused by touch pressure/force applied to the touch surface, at the touch button defined by the capacitive XY-position sensor, which causes a resultant deflection of the conductive target 25A toward the Z inductor coil 25.

The dual (XY/Z) touch sensor uses XY-position sensing, combined with Z-force sensing to detect a button-press condition as an XY-position button-touch sensed contemporaneously with a Z-force button-press.

Figure 1B:
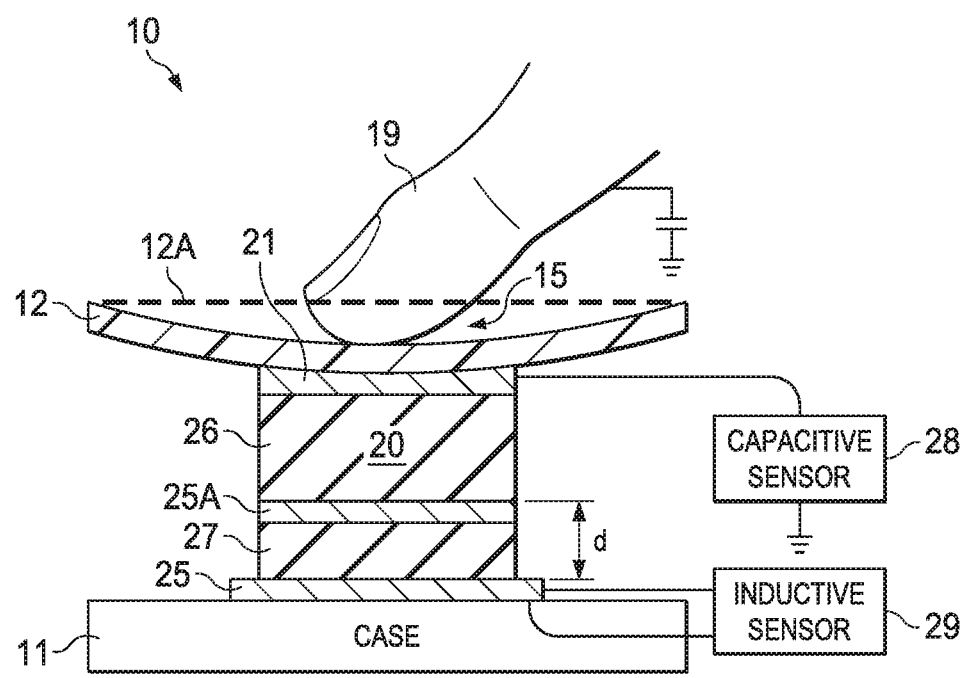

When touch button 15 is touched, the change in capacitance of the XY capacitive electrode is sensed by the capacitive sensor electronics 28, and detected as an XY-position button-touch. XY capacitive electrode is disposed in contact with touch surface 12, so that a button-press force on touch button 15 that causes deflection of the touch surface (FIG. 1B, 12/12A), is transmitted through the elastic/compressible insulator material 26/27 to cause a corresponding deflection of conductive target 25A toward Z inductor coil (reduction in the distance d), which is sensed by the inductive sensor electronics 29 (for example, as a change in coil inductance or some other parameter related to coil inductance).). That is, the Z-force inductive sensor 25/25A, 29 detects a change in the distance d as the force is applied to the surface, and if the resulting deflection of the conductive target exceeds the button-press threshold, signals a button-press event.

Note that a button press condition requires sensing both a button-touch event by the capacitive XY-position sensor, and a button-press event by the inductive Z-force sensor. In particular, a button-press event detected by the inductive Z-force sensor based on pressure outside the button-touch area that causes a surface deflection that deflects the conductive target, which does not occur concurrent with the detection of a button-touch event by the capacitive XY-position sensor, will not be detected as a button touch/press condition.

Capacitive and inductive sensor electronics 28 and 29 can be designed to provide excitation current drive respectively to the XY capacitive electrode (projected E-field), and the Z inductor coil (projected B-field), and to acquire/measure a sensor characteristic (such as capacitance, or inductance/Q-factor). The capacitive sensor electronics 28 and the inductive sensor electronics 29 provide respective XY-position (button touch) and Z-force (button-press) sensing data, for example, to a processor/controller. The processor/controller can detect a button-press condition based on the capacitive XY-position sensor signaling a button-touch event, and substantially contemporaneously, the inductive Z-force sensor signaling a button-press event.

As described below in connection with FIG. 4, the inductive Z-force sensor (Z inductor coil 25 and conductive target 25A) can be replaced with a Z capacitive sensor 23 (with a conductive target 23A). Design considerations include sensitivity to deflection (an inductive sensor can be an order of magnitude more sensitive to deflection), and susceptibility to finger capacitance (finger capacitance will not be detected by an inductive sensor).

Figure 2:
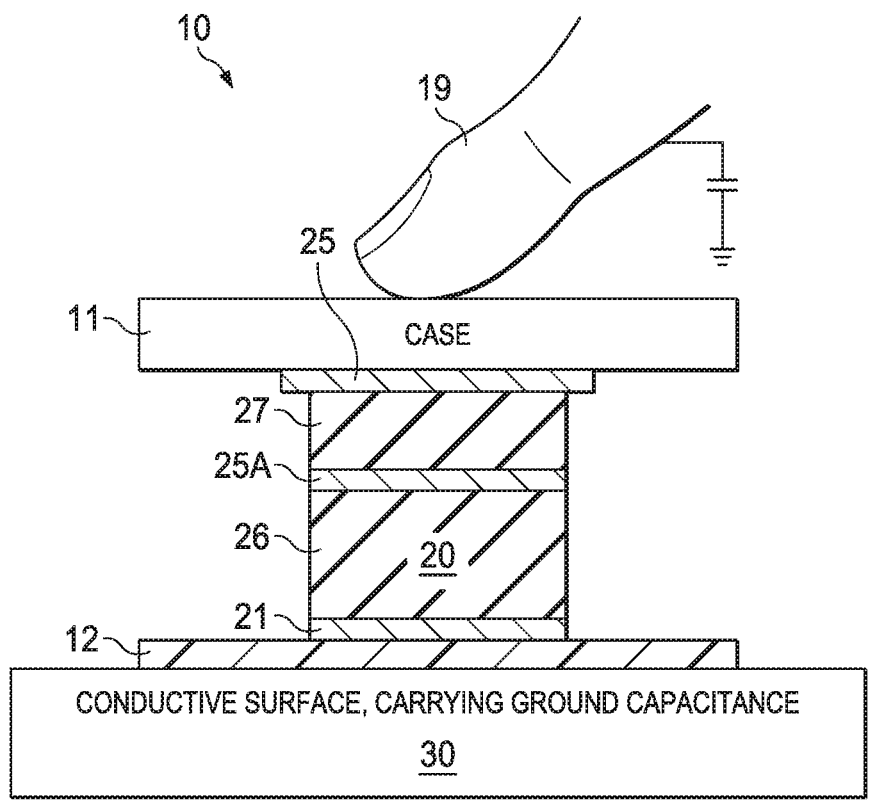
FIG. 2 illustrates a false button touch/press condition in which a device [10] is flipped over onto a conductive surface [30] carrying ground capacitance, such that the XY-position capacitive sensor [21, 28] can detect capacitance (i.e., ground capacitance from the conductive surface) at a touch-button [13], and pressure on the case (backside of the dual XY/Z sensor can be detected by the Z-force inductive sensor [25/25A, 29], which can result in signaling a false button touch/press.

FIG. 2 illustrates a condition in which a false button touch/press can be signaled. If a device 10 is flipped over onto a conductive surface 30 carrying ground capacitance, the capacitive XY-position sensor [21, 28] can detect capacitance (i.e., ground capacitance from the conductive surface) at a touch-button 15 as a false button-touch. If the case at the backside of dual XY/Z sensor 20 is pressed, the inductive Z-force sensor [25/25A, 29] can simultaneously detect a false button-press. That is, pressure on the case can cause a concurrent deflection of the Z inductor coil 25 toward the conductive target 25A, and/or a deflection of the touch surface 12, with a resultant deflection of the conductive target toward the Z inductor coil. As a result, a false button touch/press condition (deflection greater than button press threshold) can be signaled.

Figure 3:
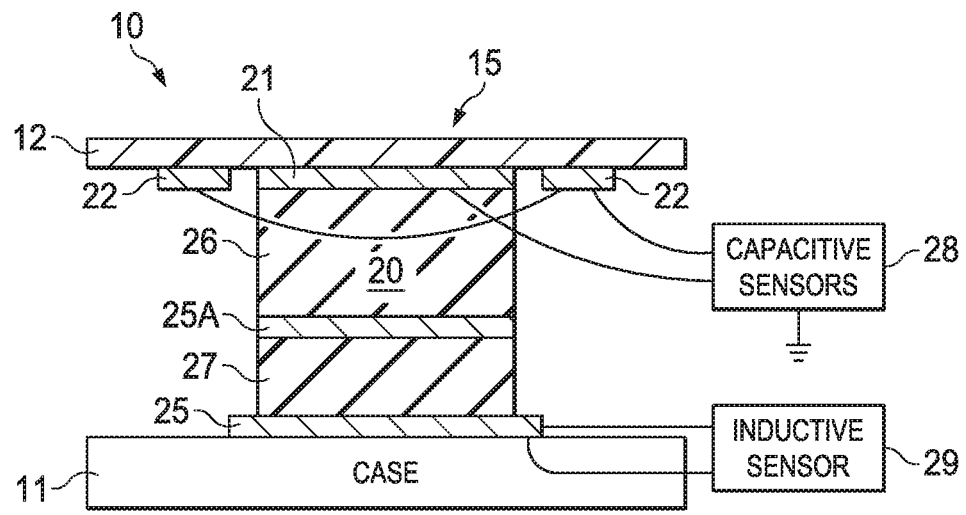
FIGS. 3 and 4 illustrate example alternate embodiments of a dual touch sensor [20] architecture with differential XY capacitive electrodes [touch button 21 and differential ring 22]
Figure 4:
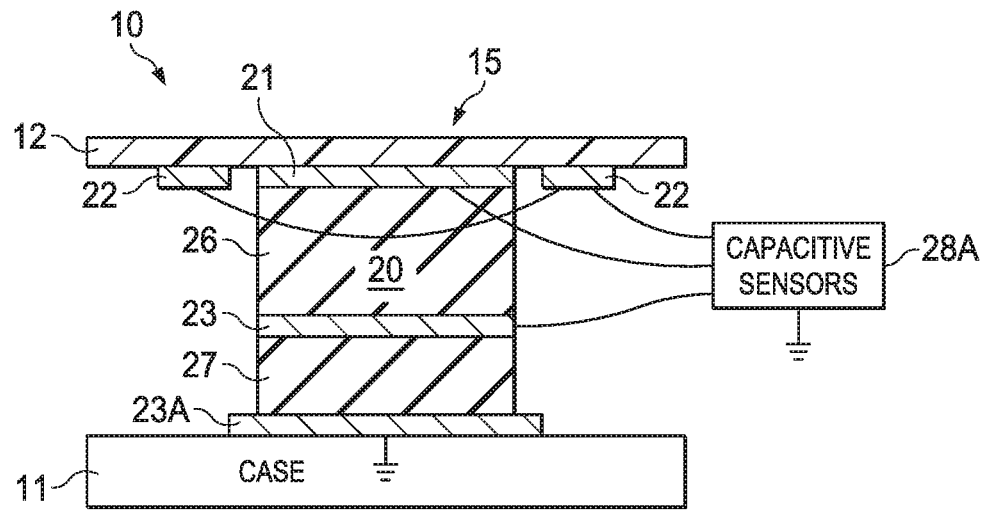

FIGS. 3 and 4 illustrate example alternate embodiments of a dual touch sensor 20 architecture, with differential XY capacitive electrodes that avoid the false button touch/press condition described in connection with FIG. 2. A second capacitive electrode 22, which can be a ring around the XY-position electrode, can be used as a differential reference.

The XY-position (button-touch) electrode 21 and the differential reference electrode 22 can be coupled to a multi-channel capacitive sensor 28, which can be configured for differential sensing, or can output separated sensor data for the XY-position (button-touch) electrode. The differential capacitance of the two electrodes (XY-position and reference) can be used to reliably detect a button-touch at the XY-position electrode, as differentiated from a false button-press condition as described in connection with FIG. 2.

FIG. 3 illustrates an example differential touch sensor 20 including a capacitive XY-position sensor 21/22, 28 with differential XY capacitive sensor electrodes 21/22 to detect touch at a touch button 15. For this example configuration, the XY capacitive electrode 21 is surrounded by an XY differential reference (ring) electrode 22. As in FIGS. 1 and 2, an inductive Z-Force sensor 25/25A, 29 including a Z inductor coil 25 is used to detect button-press surface deflection (as in FIG. 1B, 12/12A).

FIG. 4 illustrates an example differential touch sensor 20 using capacitive sensing for both XY-position (button-touch) and Z-force (button-press). XY-position (button-touch) is sensed by differential capacitive electrodes 21/22. Z-force (button-press) is sensed by capacitive electrode 23 and an associated conductive target 23A, disposed in touch sensor 20 intermediate the capacitive electrodes 21/22 and 23. Multi-channel capacitive sensor electronics 28A can be used with the capacitive electrodes 21/22 and 23.

Dual XY-position 21/22 and Z-force 23 capacitive electrodes are used because a large capacitance detected by the XY-position electrode can be caused by either increased pressure, or due to increased capacitance from a larger finger area, which can't be distinguished. Touch surface capacitance does not affect the Z-force capacitance detected by the capacitive Z-force electrode 23, deflected toward the conductive target 23A opposite the surface.

Although, the sensitivity of the Z-force sensing will generally not be as good as with an inductive Z-force sensor, this alternate embodiment can offer design flexibility that can be advantageous for certain applications.

The Embodiments illustrated in FIGS. 1A/1B, 3 and 4 use a capacitive XY-position sensor. Other sensing technologies can be used for the XY-position sensor to detect a button-touch, including optical and ultrasound.

Figure 5:
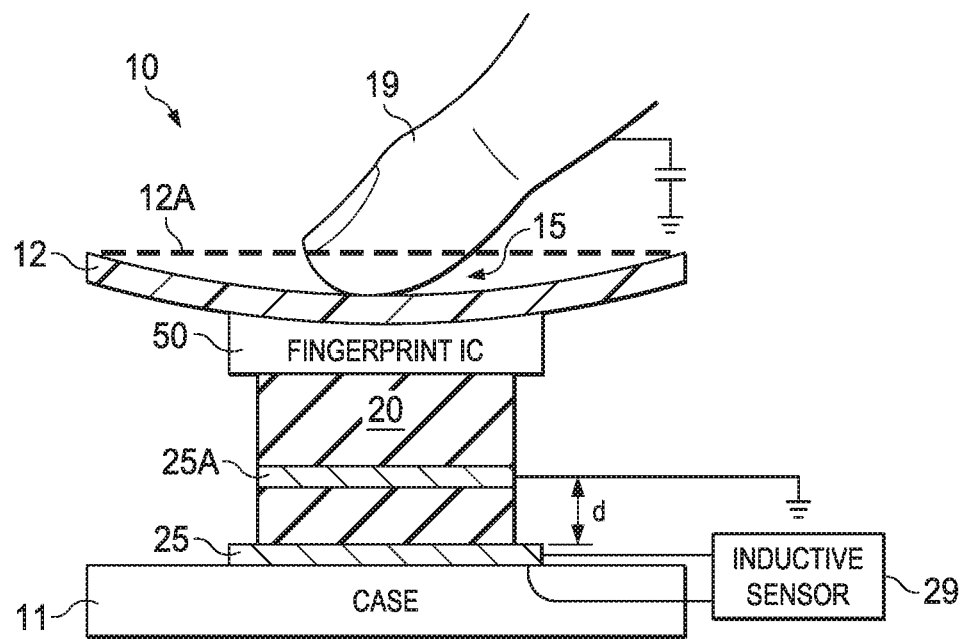
FIGS. 5 and 6 illustrate example alternate embodiments of the dual touch sensor [20] architecture in which the XY-position sensor is a fingerprint sensor [50] (such as optical), so that the fingerprint sensor detects an XY-position button-touch.
Figure 6:
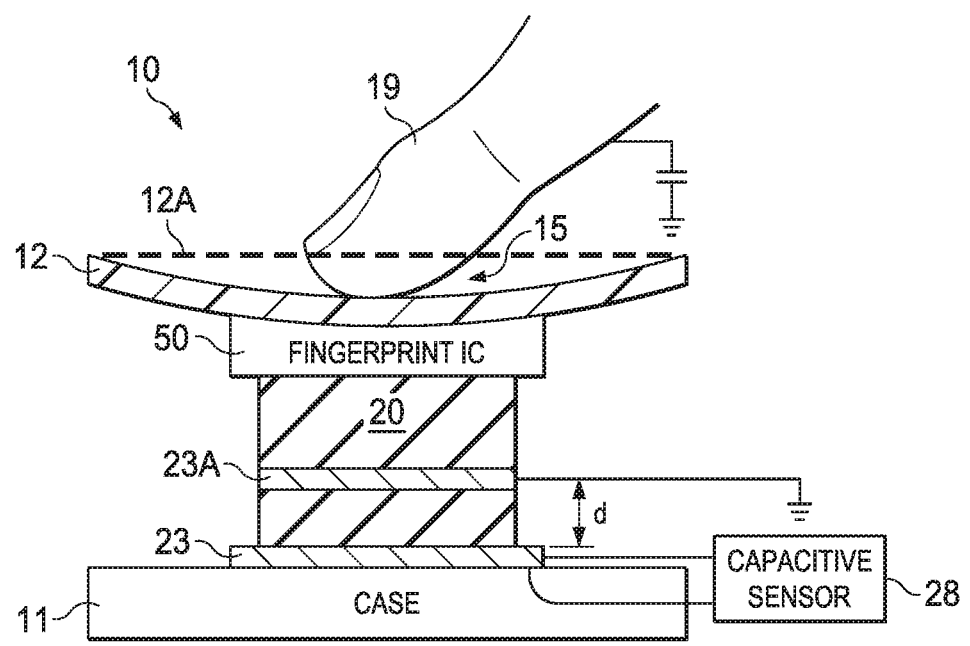

FIGS. 5 and 6 illustrate example alternate embodiments of the dual touch sensor 20 architecture in which the XY-position sensor is a fingerprint sensor 50 (such as an optical fingerprint sensor). For these embodiments, fingerprint sensor 50 detects an XY-position button-touch.

FIG. 5 illustrates a dual touch sensor 20 with an XY fingerprint sensor 50, and a Z-force inductive sensor 25/25A, 29. FIG. 6 illustrates a dual touch sensor 20 with an XY fingerprint sensor 50, and a Z-force capacitive sensor 23/23A, 28.

The Disclosure provided by this Description and the Figures sets forth example embodiments and applications illustrating aspects and features of the invention, and does not limit the scope of the invention, which is defined by the claims. Known circuits, connections, functions and operations are not described in detail to avoid obscuring the principles and features of the invention. These example embodiments and applications, including example design considerations/choices/tradeoffs, can be used by ordinarily skilled artisans as a basis for modifications, substitutions and alternatives to construct other embodiments, including adaptations for other applications.

The invention claimed is:

1. A device, comprising
   a touch surface that is deflectable with touch pressure applied to the touch surface having a button area defined on the touch surface;
   a touch sensor assembly including:
      a capacitive sensor attached to a backside of the touch surface, having a co-planar touch button and a differential reference capacitive ring providing a reference capacitance, wherein the capacitive sensor includes an XY-position sensor including an XY electrode to define an XY sensing area corresponding to the button area, the XY-position sensor configured to sense a touch within the XY sensing area as a button-touch event;
      a first compressible elastic insulator attached to the capacitive sensor on a first surface opposite the touch surface;
      a Z-force sensor attached to the first compressible elastic insulator on a surface opposite the first surface, and including a Z-electrode, with a Z-target, to sense touch-pressure deflection of the touch surface that exceeds a button-press threshold as a button-press event;
the Z-electrode comprising one of a Z inductor coil and a Z capacitive electrode;
the Z-force sensor comprising either:
the Z-target disposed between the Z inductor coil and the XY electrode, the Z-target separated from the XY electrode and the Z inductor coil by the first compressible elastic insulator, such that the touch-pressure deflection of the touch surface causes a corresponding movement of the Z target toward the Z inductor coil, or
the Z capacitive electrode disposed between the Z-target and the XY electrode, the Z capacitive electrode separated from the XY electrode and the Z-target by the first compressible elastic insulator, such that the touch-pressure deflection of the touch surface causes a corresponding movement of the Z capacitive electrode toward the Z-target;
a second elastic insulator separating the X-Y position sensor from the Z-force sensor;
sensor electronics coupled to the XY-position sensor and the Z-force sensor to detect, as a button touch-press condition, the XY-position sensor sensing a button-touch event, substantially contemporaneous with the Z-force sensor sensing a button-press event.

2. The device of claim 1, wherein the XY sensor comprises one of:
a capacitive XY sensor, including an XY capacitive electrode disposed at the touch surface opposite the button area to define an XY capacitive sensing area corresponding to the button area; and
a fingerprint sensor to detect a finger touch at the button area, with or without fingerprint verification.

3. The device of claim 1, wherein
the XY sensor comprises a capacitive XY sensor, including an XY capacitive electrode disposed at the touch surface opposite the button area to define an XY capacitive sensing area corresponding to the button area; and
further comprising a differential reference capacitive electrode, co-planar with and adjacent to the XY-position capacitive electrode;
the sensor electronics coupled to the XY capacitive electrode and the differential reference capacitive electrode.

4. The device of claim 3, wherein the differential reference capacitive electrode is ring-shaped around a substantial portion of the circumference of the XY capacitive electrode.

5. The device of claim 1, wherein the surface is a glass display panel.

6. A device, comprising:
a case; including
a touch surface deflectable based on touch pressure applied to the touch surface;
a button area defined on the touch surface;
a touch sensor assembly within the case, including:
a capacitive sensor having a co-planar touch button and a differential reference capacitive ring providing a reference capacitance, the capacitive sensor attached to a backside of the touch surface, wherein the capacitive sensor includes an XY-Position sensor, including:
an XY capacitive electrode to define a projected capacitance XY sensing area substantially coextensive with the button area; and
capacitive sensor electronics coupled to the XY capacitive electrode and the differential reference capacitive ring to capture differential capacitance measurements, including sensing human body capacitance within the XY capacitive sensing area as a button-touch event; and
an inductive Z-Force sensor, including
a Z inductor coil spaced from the XY capacitive electrode,
a conductive target disposed between the Z inductor coil and the XY capacitive electrode, and
inductive sensor electronics coupled to the Z inductor coil to capture inductance measurements, and
a first elastic insulator disposed between the XY capacitive electrode and the conductive target, and between the conductive target and the Z inductor coil, such that the touch-pressure deflection of the touch surface causes a corresponding movement of the Z conductive target toward the inductor coil,
the inductive sensor electronics to capture changes in inductance caused by touch-pressure deflection of the touch surface that causes movement of the Z conductive target toward the Z inductor coil, including sensing touch-pressure deflection that exceeds a button-press threshold as a button-press event;
a second elastic insulator separating the X-Y position sensor from the Z-force sensor;
such that a button touch-press condition corresponds to the capacitive sensor electronics sensing a button-touch event, and the inductive sensor electronics substantially contemporaneously sensing a button-press event.

7. The device of claim 6, further comprising:
a differential reference capacitive electrode, co-planar with and adjacent to the XY capacitive electrode;
the capacitive sensor electronics coupled to the XY capacitive electrode and the differential reference capacitive electrode.

8. The device of claim 7, wherein the differential reference capacitive electrode is ring-shaped around a substantial portion of the circumference of the XY capacitive electrode.

9. The device of claim 6, wherein the surface is a glass display panel.

10. A method of touch force sensing suitable for implementing a button defined on a surface of a device, comprising:
attaching a capacitive sensor having a co-planar touch button and a differential reference capacitive ring providing a reference capacitance, and including an XY sensor to a device touch surface structure opposite a button area corresponding to a button, to define an XY sensing area corresponding to the button area,
sensing a human body touch at the XY sensing area as a button-touch event;
sensing a touch-pressure deflection of the device surface with a Z-force sensor, including sensing a touch-pressure deflection that exceeds a button-press threshold as a button-press event;
the Z-force sensor including a Z-electrode, with a Z-target, the Z-electrode comprising one of a Z inductor coil and a Z capacitive electrode, the Z-force sensor comprising either:
the Z-target disposed between the Z inductor coil and the XY electrode, the Z-target separated from the XY electrode and the Z inductor coil by the first compressible elastic insulator, such that the touch-pressure deflection of the touch surface causes a corresponding movement of the Z target toward the Z inductor coil, or the Z capacitive electrode disposed between the Z-target and the XY electrode, the Z capacitive electrode separated from the XY electrode and the Z-target by the first compressible elastic insulator, such that the touch-pressure deflection of the touch surface causes a corresponding movement of the Z capacitive electrode toward the Z-target;

a second elastic insulator separating the X-Y position sensor from the Z-force sensor; and signaling the button-press event.

11. The method of claim 10, wherein the XY sensor comprises one of:

a capacitive XY sensor, including an XY capacitive electrode disposed at the surface opposite the button area to define an XY capacitive sensing area corresponding to the button area; and a fingerprint sensor to detect a finger touch at the button area, with or without fingerprint verification.

12. The method of claim 10:

wherein the XY sensor comprises a capacitive XY sensor, including an XY capacitive electrode disposed at the touch surface opposite the button area to define an XY capacitive sensing area corresponding to the button area; and further comprising a differential reference capacitive electrode, co-planar with and adjacent to the XY-position capacitive electrode.

13. The method of claim 10, wherein the surface is a glass display panel.

* * * * *